United States Patent [19]
Inaba

[11] Patent Number: 4,841,354
[45] Date of Patent: Jun. 20, 1989

[54] ELECTRONIC DEVICE WITH PERIPHERAL PROTECTIVE ELECTRODE

[75] Inventor: Tohru Inaba, Takasaki, Japan
[73] Assignee: Hitachi, Ltd., Tokyo, Japan
[21] Appl. No.: 188,080
[22] Filed: Apr. 28, 1988

Related U.S. Application Data

[63] Continuation of Ser. No. 921,525, Oct. 22, 1986, abandoned, which is a continuation of Ser. No. 535,234, Sep. 23, 1983, abandoned.

[30] Foreign Application Priority Data

Sep. 24, 1982 [JP] Japan ................................. 57-16439

[51] Int. Cl.⁴ ............................................. H01L 23/48
[52] U.S. Cl. ......................................... 357/71; 357/40; 357/54; 357/68; 357/55; 357/52; 357/53
[58] Field of Search ....................... 357/40, 54, 71, 68, 357/52, 53, 55, 84, 72, 52 D

[56] References Cited

U.S. PATENT DOCUMENTS 3,751,292  8/1973  Kongable .................... 357/54 X
3,801,880  4/1974  Harada et al. ............... 357/40 X
3,997,964 12/1976  Holbrook et al. ............ 357/55 X
4,001,870  1/1977  Saiki et al. ................... 357/54
4,040,083  8/1977  Saiki et al. ................... 357/54
4,472,730  9/1984  Ohta ........................... 357/54 X

FOREIGN PATENT DOCUMENTS 59-13364  1/1984  Japan ........................... 357/40 X
2083283   3/1982  United Kingdom ......... 357/40 X Primary Examiner—Andrew J. James
Assistant Examiner—William A. Mintel
Attorney, Agent, or Firm—Antonelli, Terry Wands

[57] ABSTRACT

The present invention is intended to enhance the moisture-proofing of an electronic device having a chip including a substrate and a wiring structure which is formed on a major surface of the substrate and which consists of an electrical insulating film and metal wiring. A protective electrode which is made of a metal connecting to the substrate is provided between an outer periphery of the chip and the metal wiring formed in a peripheral part of the chip in a manner to penetrate the electrically insulating film.

15 Claims, 6 Drawing Sheets

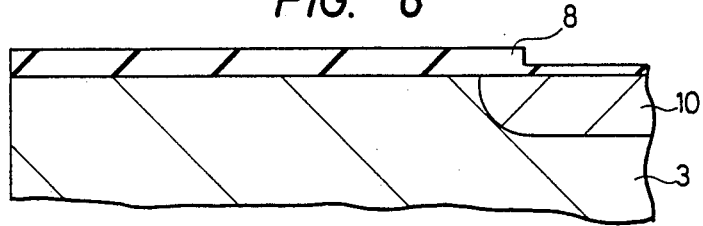
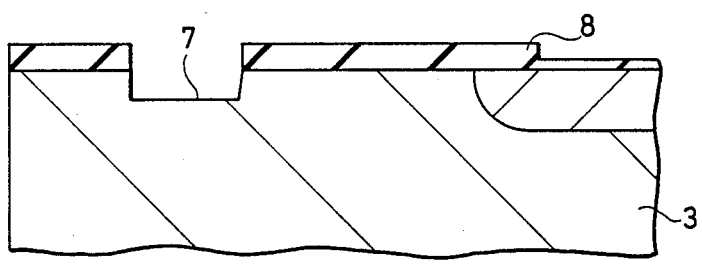
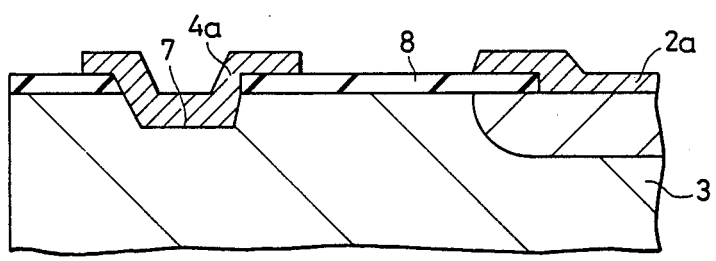
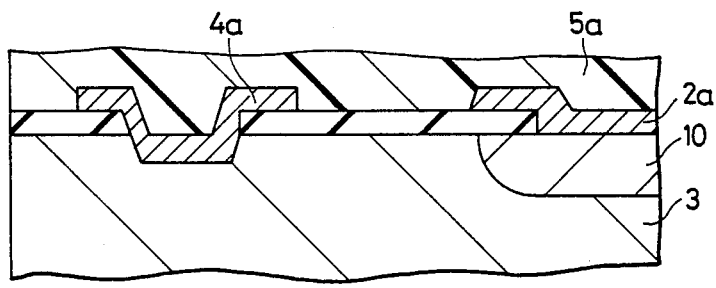

ELECTRONIC DEVICE WITH PERIPHERAL PROTECTIVE ELECTRODE

This application is a Continuation of application Ser. No. 921,525, filed Oct. 22, 1986, now abandoned, which is a Continuation application of Ser. No. 535,234 filed on Sept. 23, 1983, now abandoned.

BACKGROUND OF THE INVENTION

The present invention relates to electronic devices, for example, a semiconductor integrated circuit device (hereinbelow, termed "IC").

In recent years, as the packaging density has been rendered higher and higher in bipolar ICs and related devices and as the wiring has become multilayered, organic polymer insulator films such as polyimide resin films, which are excellent in thermal resistance, microworkability, etc., have come into frequent use as inter-layer insulating films or passivation films. An example in which a polyimide resin is employed for the inter-layer insulating film of multilayer wiring is disclosed in the Official Gazette of Japanese Laid-Open Patent Application No. 55-150254. The inventor of the present application has experimented with such a resin-molded IC wherein a chip is encapsulated in a molded resin with the chip comprising a plurality of semiconductor elements which are formed in one major surface of a semiconductor substrate, Al wiring leads which connect the semiconductor elements electrically, and the aforementioned interlayer insulating film which is made of the polyimide resin. From these experiments, the inventor has found that the moisture-proofing of the device deteriorates in the vicinity of the periphery of the chip (approximately 40–50 $\mu$m from the peripheral edge), and water intrudes into the chip through this part, so the first layer of Al wiring is liable to corrosion. As the cause of such deterioration of the moisture-proofing of the device, the inventor has determined that the polyimide resin binds poorly with a phosphosilicate glass (PSG) film or oxide ($SiO_2$) film which is formed on the major surfaces of the semiconductor substrate. This poor binding leads to a great external stress (e.g., 60 kg/cm$^2$) which acts on the IC chip due to the curing of a resin in the resin molding operation to create a separation of the polyimide resin in the peripheral part of the chip. The "separation" is the state of inferior adhesion which develops in such a manner that the soft polyimide resin becomes distorted, shifts or comes off at its interface with the underlying hard $SiO_2$-based film. As the multilayer wiring of the semiconductor chip is increasingly built up, this chip becomes more liable to the stress due to the shrinkage of the molded resin, and the separation of the resin film in the peripheral part becomes more conspicuous.

SUMMARY OF THE INVENTION

An object of the present invention is to enhance the moistureproofing of an electronic device having a multilayer-wired structure which employs a resin film as an inter-layer insulating film.

The present invention is characterized in that, to the accomplishment of this and other objects, electrodes for protecting internal wiring leads formed in a chip are disposed in peripheral parts of the chip. This prevents any external stress from acting on regions where the internal wiring leads are formed.

BRIEF DESCRIPTION OF THE DRAWINGS.

FIGS. 6 to 12 are sectional views showing a process for manufacturing an IC which is the embodiment of the present invention shown in FIG. 4.

DESCRIPTION OF THE PREFERRED EMBODIMENTS

Figure 1:
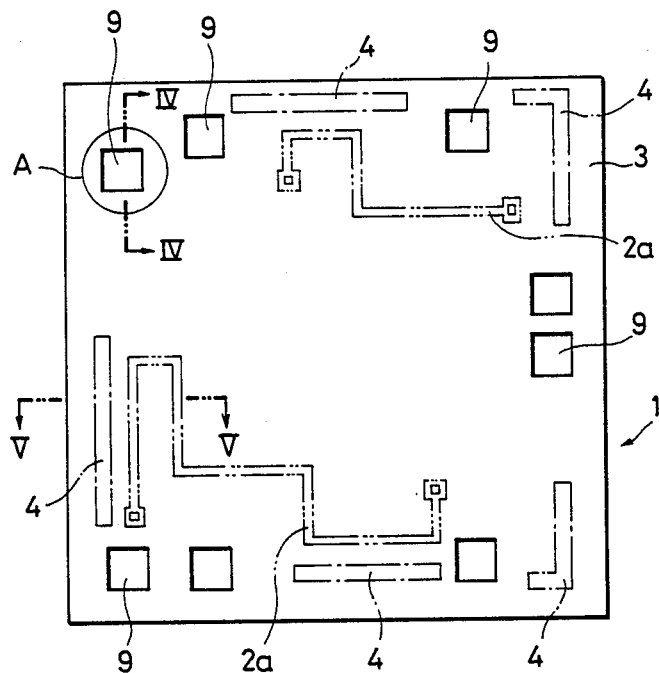
FIG. 1 is a typical plan view of an IC chip embodying the present invention.

Embodiment 1:

One desirable form of this invention is that, as shown in FIG. 1, protective electrodes 4 connected to a semiconductor substrate 3 and penetrating multilayers insulating films (not shown in the figure) disposed on the major surface of the semiconductor substrate are provided in the peripheral parts of an IC chip 1 so as to surround a region where internal wiring leads 2a are formed.

Figure 2:
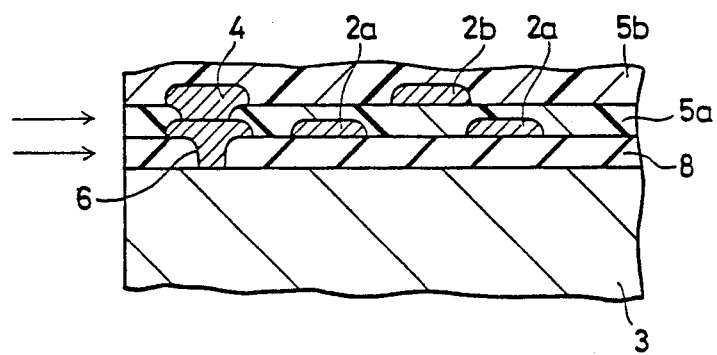
FIG. 2 is an enlarged sectional view taken along line V—V in the IC chip shown in FIG. 1.
Figure 3:
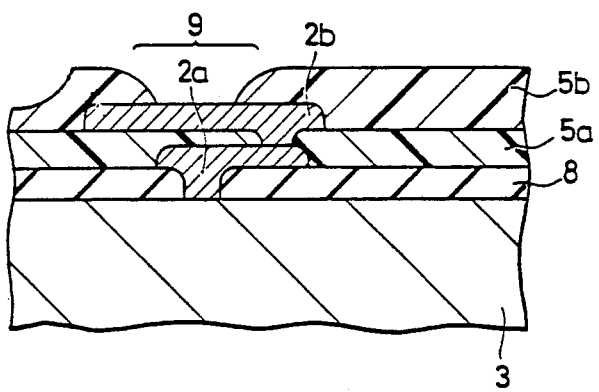
FIG. 3 is an enlarged sectional view taken along line IV—IV in the chip of FIG. 1.

FIG. 2 shows an enlarged sectional view of the chip 1 in FIG. 1 taken along line V—V. In FIG. 2, numeral 3 designates a Si semiconductor substrate, which is formed in its major surface with a plurality of diffused layers constituting semiconductor elements, not shown. Numeral 8 designates an oxide film ($SiO_2$ film) (whose surface is sometimes covered with a phosphide film of PSG or the like). Symbols 5a and 5b denote inter-layer insulating films (not shown in FIG. 1) which are formed in such a way that a polyimide resin (for example, polyimide isoindoloquinazolinedione) is applied in a liquid state by spin coating and then thermally set. Symbol 2a indicates a first layer of Al wiring, and symbol 2b a second layer of Al wiring. Numeral 4 indicates a double-layer protective electrode, which is connected to the Si substrate 3 through a penetrating hole 6 provided in the two layers of inter-layer insulating films 5a, 5b. Numeral 9 in FIG. 1 indicates a bonding pad. As shown in FIG. 3, the bonding pad 9 is formed as a part of the second layer of Al wiring 2b, and the surface of the pad is exposed by providing a large window in the upper layer of inter-layer insulating film 5b.

In this embodiment, the protective electrodes are disposed in the peripheral parts of the chip as shown in FIG. 1. As shown in FIG. 2, the protective electrode 4 absorbs an external stress (indicated by an arrow) tending to act on the vicinity of the first layer of Al wiring 2a (the peripheral part of the chip) and thus prevents the separation of the polyimide resin film from the $SiO_2$ film.

The protective electrode arrangement need not always be put into a structure which surrounds the whole periphery of the chip. More specifically, the wire bonding pads 9 for leading out electrodes are disposed in the peripheral parts of the chip, and the metal wiring leads such as 2a and 2b held in contact with the substrate run in the vicinities thereof as illustrated in FIG. 3. Therefore, the peripheral parts of the chip are comparatively reinforced against external stresses. For this reason, separation of the inter-layer insulating films is not likely to occur in the vicinities of the bonding pads 9. Therefore, even when the protective electrodes 4 are disposed only in the parts formed with no bonding pad which are susceptible to external stresses, as in this embodiment, the effects of the present invention can be attained. Of course, if desired, the protective electrode means may be formed so as to surround the whole periphery of the chip.

In accordance with the present invention having such a construction as discussed above, the object of the invention can be achieved for the following reasons:

(1) It is as previously stated that the organic polyimide resin used for an inter-layer insulating film affords a film hardness lower than that of inorganic glass films, and that when subjected to a stress, it is especially deformed in the peripheral part of a chip, to cause separation or shift. In this regard, when the protective electrode 4 connected to the semiconductor substrate via the through hole of the insulating film is provided in the peripheral part of the chip as in the present invention, it serves as a bank against the stress, to prevent the stress from acting on the region for forming the internal wiring lead therein and to present the occurrence of the inferior adhesion between the inorganic glass film and the inter-layer insulating film. As a result, the moisture-proofing can be enhanced to prevent the corrosion of the Al wiring (particularly, the first layer of wiring) in the peripheral part of the chip.

(2) The protective electrode made of metal is formed by stacking the evaporated Al films for forming the wiring, and has a good adhesion for the surface of the semiconductor substrate of Si or the like. Since the stacked metal layers are higher in mechanical strength than the multilayered insulating films, they can satisfactorily endure the external stress.

According to the present invention described in conjunction with the above-described embodiment, the protective electrodes disposed in the pertinent peripheral parts of the chip absorb the stresses externally applied in the resin molding operation and prevent the separation of the polyimide resin film from the inorganic glass film ($SiO_2$ film) in the peripheral parts of the chip. As a result, the moisture-proofing of an IC having a multilayer wiring structure can be enhanced structure can be enhanced. Embodiment 2

Figure 4:
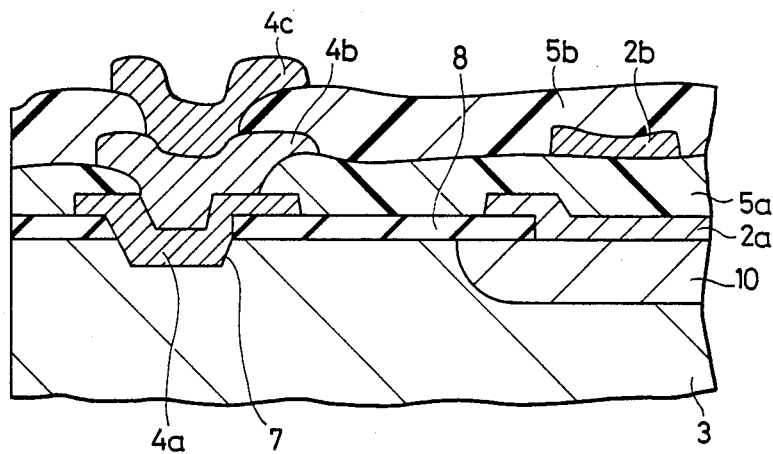
FIG. 4 is a sectional view of essential portions showing another embodiment of the present invention.
Figure 5:
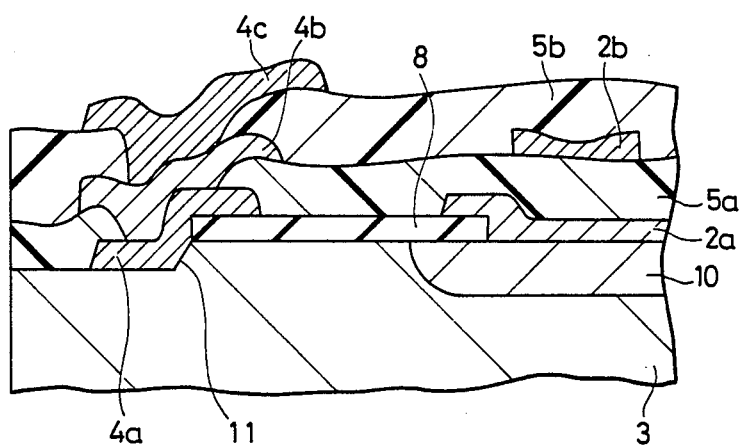
FIG. 5 is a sectional view of essential portions showing another embodiment of the present invention.

Another desirable form of this invention is that, as shown in FIGS. 4 and 5, a protective electrode 4a of a metal which connects to a recess 7 or a step part 11 formed in the surface of a semiconductor substrate 3 and which penetrates a multilayer insulating film 5 is provided in the peripheral part of an IC chip so as to surround regions where internal wiring leads 2a and 2b are formed. In this embodiment, the protective electrode consists of three layers and penetrates, not only the inter-layer insulating film, but also the final passivation film 5b. When, in this manner, the recess or the step part (which is lower on the peripheral side and higher on the inner side) is formed in the peripheral part of the substrate by etching in advance and the metal to form the protective electrode is deposited so as to extend over the recess or the step part, the protective electrode is fixed more securely and becomes more effective to absorb the external stress.

Now, the manufacturing process of the IC of Embodiment 2 will be briefly explained with reference to FIGS. 6–12 which are partial sectional processing flow diagrams of an IC chip.

(1) In one major surface of an $N^-$-type Si semiconductor substrate 3 (wafer), a diffused layer 10 for constructing a semiconductor element is formed in accordance with a conventional IC process, as shown in FIG. 6.

(2) The field oxide film 8 in the peripheral part is partially removed. As illustrated in FIG. 7, using the resultant oxide film 8 as a mask, the semiconductor substrate is selectively etched to form a recess 7. This recess is formed by utilizing anisotropic etching which employs an alkaline etchant.

(3) After the oxide film is photoetched for contracts, Al is evaporated and then etched for patterning. Thus, as shown in FIG. 8, a first layer of wiring 2a is formed, and simultaneously, the first layer part 4a of a protective electrode is formed so as to extend over the recess 7.

(4) A polyimide resin is applied on the whole surface by spin coating, and a first layer of inter-layer insulating film 5a is formed as shown in FIG. 9.

Figure 10:
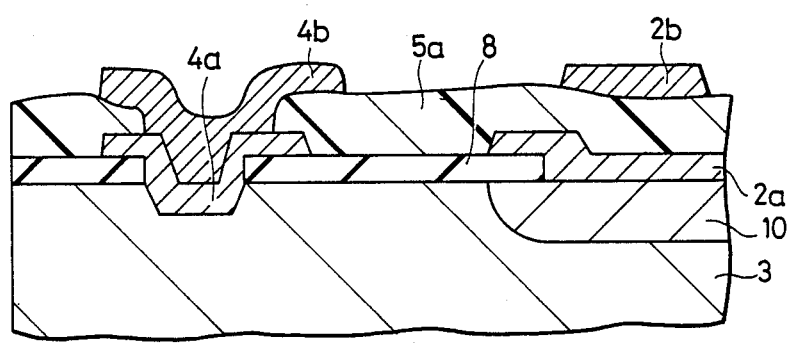

(5) After the inter-layer insulating film 5a is etched to form a through hole, Al is evaporated and etched for patterning. Thus, as shown in FIG. 10, a second layer of wiring 2b is formed, and the second layer part 4b of the protective electrode connecting with the first layer part 4a is formed so as to be placed on the latter part.

Figure 11:
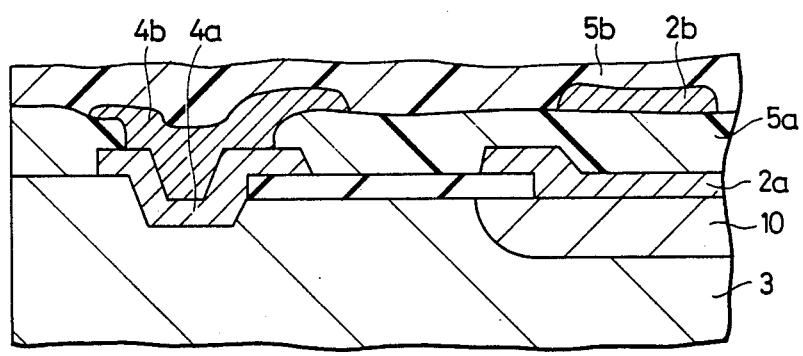

(6) The polyimide resin is applied on the whole surface, to form a second layer of inter-layer insulating film 5b as shown in FIG. 11.

Figure 12:
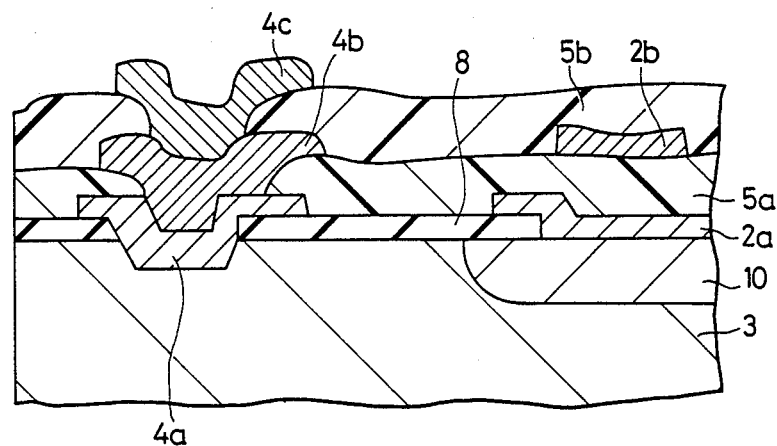

(7) A through hole is provided in the second layer of inter-layer insulating film (final passivation film) 5b, and Al is evaporated and etched for patterning. Thus, as shown in FIG. 12, the uppermost layer part 4c of the protective electrode is stacked and formed on the second layer part 4b thereof. Although not illustrated, a bonding pad is formed in another peripheral part of the chip by the same step of evaporating Al. As stated before, the bonding pad has the function of protecting the internal wiring in a manner similar to the protective electrode.

In this manner, the formation of the protective electrode can be executed simultaneously with the multilayer wiring of the IC chip and by the use of the ordinary techniques for IC formation. Only the mask patterns need to be changed and there is no need for the addition of any special step.

Embodiment 3

While, in the foregoing embodiments, polyimide resin films have been set forth as examples, films of other organic materials such as silicon resin films differ in hardness from inorganic glass films and are liable to inferior adhesion when subjected to an external stress. Thus, the application of the present invention to the films of the other organic materials is effective. In addition, the application of the present invention is effective for ICs which employ materials other than organic resins (for example, a $SiO_2$ film, PSG film and SiN film) for inter-layer insulating films (passivation films).

As noted above, $SiO_2$ and PSG films are quite hard. Therefore, when an external stress has acted on the $SiO_2$ or PSG film in a resin molding operation or the like, the film does not fall into a separated state as in the case of the polimide resin, but instead is liable to cause cracks or to move along with Al wiring in the surface of an IC chip. This can disconnect and break the wiring.

With the present invention, this problem can also be prevented. In this case, to the end of protecting the internal wiring from an external intense stress, a structure is desirable in which a recess is provided in the peripheral part of the chip and the protective electrode is formed thereon. That is, since the protective electrode is firmly fixed by the recess provided in the peripheral part of the chip and becomes difficult to move laterally, the effect of absorbing the external stress is enhanced.

Figure 13:
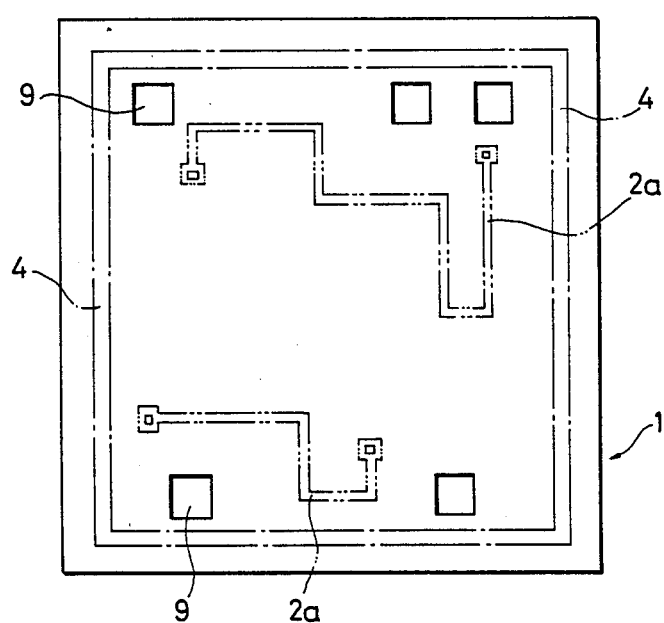
FIG. 13 is a typical plan view of an IC chip which is still another embodiment of the present invention.

Needless to say, the protective electrode may be formed so as to surround the whole periphery of the chip as shown in FIG. 13. In this case, there is no part of the chip which is weak against the external stress. Therefore, the separation of the interlayer insulating film attributed to the external stress can be prevented virtually completely. In FIG. 13, the same parts as in the preceding drawings are indicated by the same symbols.

The present invention is naturally also applicable to an IC having a single-layer wiring structure, and not just to multilayer devices.

It should be noted that the present invention is effective when applied to a bipolar IC (or discrete element) employing a Si substrate, an IC (or discrete element) employing GaAs, etc.

It is to be understood that the above-described arrangements are simply illustrative of the application of the principles of the invention. Numerous other arrangements may be readily devised by those skilled in the art which embody the principles of the invention and fall within its spirit and scope.

I claim:

1. A semiconductor device encapsulated with a resin comprising:
    a substrate;
    a plurality of semiconductor regions formed in one major surface of said substrate for providing semiconductor elements;
    a first film comprised of an inorganic insulating material extending over said substrate;
    a first wiring layer formed over said first film and coupled to one of said semiconductor regions through an opening provided in said first film;
    a second film comprised of an organic insulating material, said second film being provided over said first wiring layer in said first film; and
    stress absorbing means for preventing deformation of said first wiring layer and said second film being formed adjacent to a peripheral portion of said substrate to absorb stress caused during curing of said resin, said stress absorbing means comprising a protective electrode which is made up of lower and upper metal wiring layers comprising aluminum, one superimposed above the other, and which penetrates said first and second films to connect said upper metal wiring layer to said lower metal wiring layer and said lower metal wiring layer to said substrate; said protective electrode being located outside of said semiconductor regions and away form said first wiring layer.

2. A semiconductor device according to claim 1, further comprising a bonding pad coupled to said first wiring layer at a location other than where said positive electrode is located.

3. A semiconductor device according to claim 1 wherein said protective electrode is provided around the complete periphery of said substrate.

4. A semiconductor device according to claim 1, further comprising a second wiring layer provided over said second film and coupled to said first wiring layer through an opening provided in said second film, wherein said protective electrode is also located between the outer periphery of said substrate and said second wiring layer formed adjacent to a peripheral portion of said substrate.

5. A semiconductor device according to claim 1, wherein said protective electrode is connected to a recess formed in the major surface of said substrate between an outer periphery of said substrate and said first wiring layer formed in a peripheral part of said substrate.

6. A semiconductor device according to claim 4, further comprising a bonding pad coupled to said first and second wiring layers at a location other than where said protective electrode is located.

7. A semiconductor device according to claim 1, wherein said first wiring layer includes a portion extending along a predetermined direction on said substrate, and wherein said protective electrode is arranged to extend substantially parallel to said portion in the same predetermined direction.

8. A semiconductor device according to claim 7, wherein said portion extending along a predetermined direction is substantially parallel to a peripheral edge of said outer periphery of said substrate.

9. A semiconductor device according to claim 1, wherein said protective electrode is comprised of metal.

10. A semiconductor device according to claim 1, wherein said first film is comprised of silicon dioxide.

11. A semiconductor device according to claim 1, wherein said first film is comprised of phosphosilicate glass.

12. A semiconductor device encapsulated with a resin comprising:
    a substrate;
    a plurality of semiconductor regions formed in one major surface of said substrate for providing semiconductor elements;
    a first film comprised of silicon dioxide extending over said substrate;
    a first wiring layer formed over said first film and coupled to one of said semiconductor regions through an opening provided in said first film, wherein said first wiring layer includes a portion extending lengthwise in a direction substantially parallel to a peripheral edge of an outer periphery of said substrate;
    a second film comprised of an organic resin, said second film being provided over said first wiring layer and said first film;
    a second wiring layer provided over said second film and coupled to said first wiring layer through an opening provided in said second film; and
    stress absorbing means for preventing deformation of said wiring layers in said second film being formed adjacent to a peripheral portion of said substrate to absorb stress caused during curing of said resin in a resin mold operation, said stress absorbing means comprises a protective electrode which is made up of lower and upper metal wiring layers comprising aluminum, one superimposed above the other, which penetrates said first and second films to connect said upper metal wiring layer to said lower metal wiring layer and said lower metal wiring layer to said substrate and which extends lengthwise in a direction substantially parallel to said portion of the first wiring layer; said protective electrode being located outside of the first wiring layer and away from said semiconductor regions.

13. A resin molded type semiconductor device comprising:

a semiconductor chip which comprises a rectangular semiconductor body, a plurality of semiconductor regions formed in one major surface of said substrate for constructing semiconductor elements, an inorganic insulating film formed on the surface of said body, a first wiring layer formed over said insulating film and coupled to one of said semiconductor regions, a portion of said first wiring layer extending along a predetermined direction, an organic insulating film being provided over said first wiring layer and said inorganic insulating film, lower and upper metal layers comprising aluminum, one superimposed over the other, being positioned between an outer periphery of said body and said first wiring layer, said lower and upper metal layers together penetrating said inorganic and organic insulating films to connect said upper metal layer to said lower metal layer and said lower metal layer to said semiconductor body and extending lengthwise in a direction substantially parallel to the portion of said first wiring layer so that the lower and upper metal layers are not electrically connected to the first wiring layer; and a mold resin which encapsulates said semiconductor chip.

14. A semiconductor device according to claim 13, wherein said inorganic insulating film is comprised of silicon dioxide and said organic insulating film is comprised of a polyimide resin film.

15. A semiconductor device according to claim 13, wherein said inorganic insulating film is comprised of phosphosilicate glass film and said organic insulating film is comprised of a polyimide resin film.

* * * * *